(12) United States Patent
Ouyang et al.

(10) Patent No.: US 8,536,461 B2
(45) Date of Patent: Sep. 17, 2013

(54) PRINTED CIRCUIT BOARD HAVING STIFF AND FLEXIBLE CHARACTERISTICS

(75) Inventors: Kuo-Hsiang Ouyang, New Taipei (TW); Yao-Shun Tseng, New Taipei (TW); Hone-Wei Tang, New Taipei (TW)

(73) Assignee: Hon Hai Precision Industry Co., Ltd., New Taipei (TW)

( * ) Notice: Subject to any disclaimer, the term of this patent is extended or adjusted under 35 U.S.C. 154(b) by 195 days.

(21) Appl. No.: 13/151,192

(22) Filed: Jun. 1, 2011

(65) Prior Publication Data

US 2012/0106115 A1    May 3, 2012

(30) Foreign Application Priority Data

Nov. 3, 2010  (TW) .............................. 99137726 A

(51) Int. Cl.
*H05K 3/46*    (2006.01)

(52) U.S. Cl.
USPC .......................................................... 174/255

(58) Field of Classification Search
USPC .......................................... 174/250, 255, 268
See application file for complete search history.

(56) References Cited

U.S. PATENT DOCUMENTS

| 5,541,813 | A | * | 7/1996 | Satoh et al. | 361/752 |
| 7,605,679 | B1 | * | 10/2009 | Doane et al. | 333/246 |
| 7,989,709 | B2 | * | 8/2011 | Tsao | 174/264 |
| 2009/0013526 | A1 | * | 1/2009 | Yang et al. | 29/835 |

FOREIGN PATENT DOCUMENTS

| CN | 2617107 Y | 5/2004 |
| CN | 201563327 U | 8/2010 |
| TW | M351376 A | 2/2009 |

* cited by examiner

*Primary Examiner* — Chau Nguyen
(74) *Attorney, Agent, or Firm* — Altis Law Group, Inc.

(57) ABSTRACT

A printed circuit board comprising a hard portion of at least one main hard PCB, and at least one secondary hard PCB; and a flexible portion to connect the main hard PCB to the secondary hard PCB both physically and electrically and enabling the secondary hard PCB to move in relation to the main hard PCB.

1 Claim, 2 Drawing Sheets

PRINTED CIRCUIT BOARD HAVING STIFF AND FLEXIBLE CHARACTERISTICS

BACKGROUND

1. Technical Field

The present disclosure relates to a printed circuit board and, particularly to a printed circuit board having the characteristics of both hard PCBs and flexible PCBs.

2. Description of Related Art

A conventional portable electronic device usually includes a printed circuit board. If a side button is arranged at one side of the portable electronic device, the side button switch will be directly mounted on the rigid printed circuit board. The switch is vulnerable to external impact and may tend to disengage from the printed circuit board. Although a conventional printed circuit board can satisfy very basic requirements, a new printed circuit board is required.

BRIEF DESCRIPTION OF THE DRAWINGS

Many aspects of the embodiments can be better understood with reference to the following drawings. The components in the drawings are not necessarily drawn to scale, the emphasis instead being placed upon clearly illustrating the principles of the present disclosure. Moreover, in the drawings, like reference numerals designate corresponding parts throughout the several views.

DETAILED DESCRIPTION

Embodiments of the present disclosure will now be described in detail below, with reference to the accompanying drawings.

Figure 1:
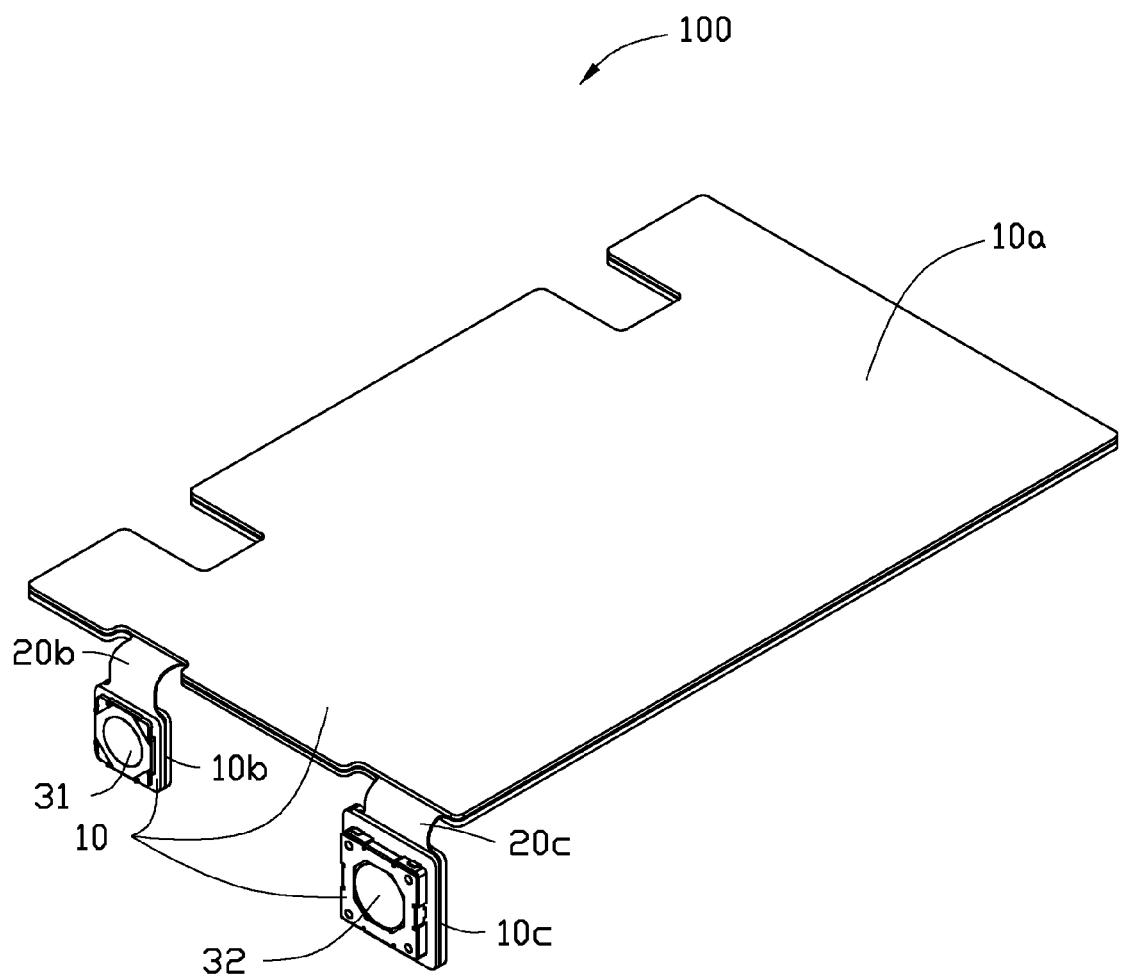
FIG. 1 is a schematic, isometric view of a printed circuit board (PCB) according to an exemplary embodiment.
Figure 2:
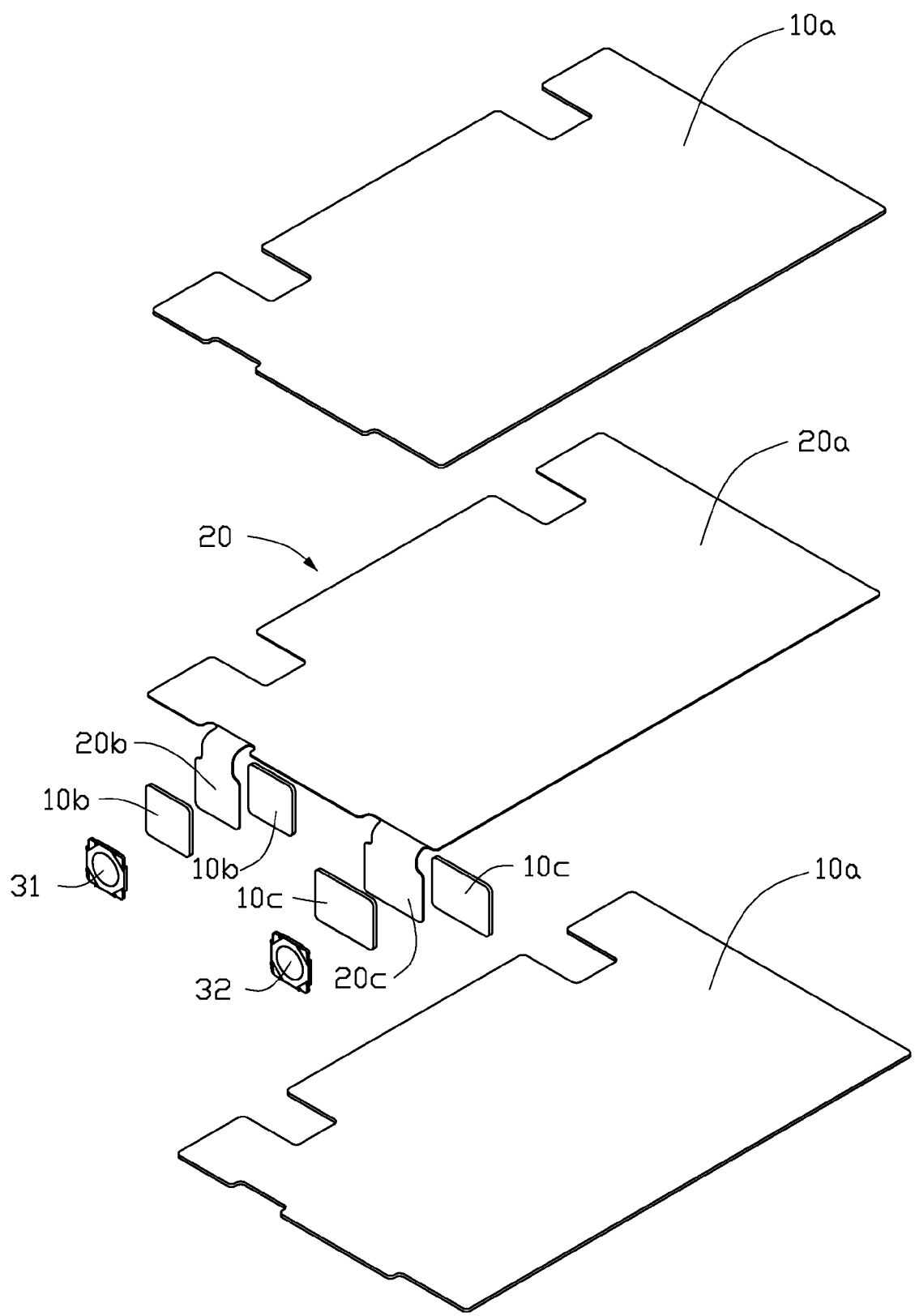
FIG. 2 is a schematic, exploded view of the PCB of FIG. 1.

Referring to FIGS. 1 and 2, the printed circuit board (PCB) 100 includes a hard portion 10 and a flexible portion 20. The hard portion 10 includes two main hard PCBs 10a, two secondary hard PCBs 10b and two secondary hard PCBs 10c. The flexible portion 20 includes flexible PCBs 20a and 20b and 20c. The hard PCBs 10b and 10c are connected to the hard PCB 20a by the flexible portions 20. The flexible portions 20 effectively create hinged connections between each of the hard PCBs 10b and 10c, and the hard PCB 10a.

The hard PCBs 10a, 10b, and 10c all include a number of conductor layers (not shown) for electrical connection with electronic components (not shown).

The flexible PCB 20a has a structure and size similar to the hard PCBs 10a, and is sandwiched between the two hard PCBs 10a. The flexible PCBs 20b and 20c extend outwards from one edge of the flexible PCB 20a. The flexible PCB 20b is sandwiched between the two hard PCBs 10b. The hard PCBs 10b are smaller in area than the flexible PCB 20b, allowing a portion of the flexible PCB 20b to be exposed. The exposed portion of the flexible PCB 20b is flexible and so the hard PCBs 10b can move with respect to the hard PCBs 10a.

The flexible PCB 20c is sandwiched between the hard PCBs 10c. The hard PCBs 10c are smaller in area than the flexible PCB 20c, allowing a portion of the flexible PCB 20c to be exposed between the hard PCBs 10a and PCBs 10c. Because the exposed portion of the flexible PCB 20c is flexible, the hard PCBs 10c can hinge with respect to the hard PCBs 10a.

Some metal-plated via holes (not shown) can be defined in the hard portions 10 for electrical connection between the flexible PCBs 20a, 20b, and 20c and the hard PCBs 10a 10b, and 10c.

In an electronic device (not shown) utilizing the PCB 100, the hard PCBs 10b and 10c are substantially at right angles to the hard PCB 10a. The hard PCBs 10b and 10c are set adjacent to the side of the electronic device. Switches 31 and 32 can then arranged as side buttons on the PCBs 10b and 10c. Since the hard PCBs 10b and 10c can move with respect to the hard PCB 10a, the switches 31 and 32 can be located at various positions with respect to the hard PCBs 10a, thereby providing more flexibility and convenience when assembling the switches 31 and 32 as side buttons on the electronic device.

While various embodiments have been described and illustrated, the disclosure is not to be constructed as being limited thereto. Various modifications can be made to the embodiments by those skilled in the art without departing from the true spirit and scope of the disclosure as defined by the appended claims.

What is claimed is:

1. A printed circuit board (PCB) comprising:
   two main hard PCB portions, and four secondary hard PCB portions; and
   a flexible portion electrically connecting the two main hard PCB portions to the four secondary hard PCB portions and enabling the two secondary hard PCB portions to move with respect to the four main hard PCB portions; the flexible portion comprising a first flexible PCB portion and two second flexible PCB portions extending outwards from one edge of the first flexible PCB portion and the first flexible PCB is arranged between the two main hard PCB portions, and the two second flexible PCB portions are arranged between each two secondary hard PCB portions; and the two secondary hard PCB portions are smaller in size than the second flexible PCB portion, allowing an area of the second flexible PCB portion to be exposed between the main hard PCB portions and the secondary hard PCB portions.

* * * * *